United States Patent [19]

Gardenghi et al.

[11] 4,251,741
[45] Feb. 17, 1981

[54] HIGH POWER PULSER

[75] Inventors: Robert A. Gardenghi; Edward H. Hooper, both of Catonsville, Md.

[73] Assignee: The United States of America as represented by the Secretary of the Air Force, Washington, D.C.

[21] Appl. No.: 10,204

[22] Filed: Feb. 8, 1979

[51] Int. Cl.³ .............................................. H03K 3/57
[52] U.S. Cl. .................................... 307/260; 307/246; 307/268; 307/252 Q; 328/65
[58] Field of Search ................... 328/65; 307/246, 260, 307/268, 252 Q

[56] References Cited

U.S. PATENT DOCUMENTS

| | | | |
|---|---|---|---|
| 3,578,986 | 5/1971 | McGuffin et al. | 307/246 |
| 3,772,601 | 11/1973 | Smith | 328/65 |
| 3,772,613 | 11/1973 | Smith | 328/65 X |
| 4,058,742 | 11/1977 | O'Brien | 307/260 |
| 4,090,140 | 5/1978 | Carter | 328/65 |

FOREIGN PATENT DOCUMENTS 1260967  1/1972  United Kingdom ...................... 328/65

Primary Examiner—John S. Heyman
Attorney, Agent, or Firm—Donald J. Singer; Willard R. Matthews, Jr.

[57] ABSTRACT

A high power pulser, suitable for high energy laser and radar applications, that provides both uniform loading on the source and power combining to achieve high peak power output pulses while eliminating the customary transformer-rectifier power supply is realized by connecting a number of conventional line type AC resonant charging pulsers together in a manner that allows them to be sequentially charged from a polyphase A.C. generator and, upon command, simultaneously discharged into a load.

6 Claims, 5 Drawing Figures

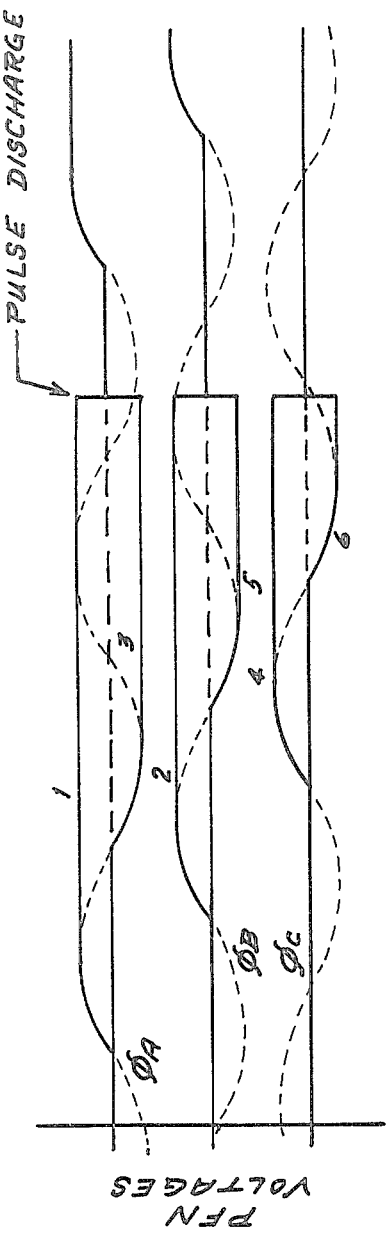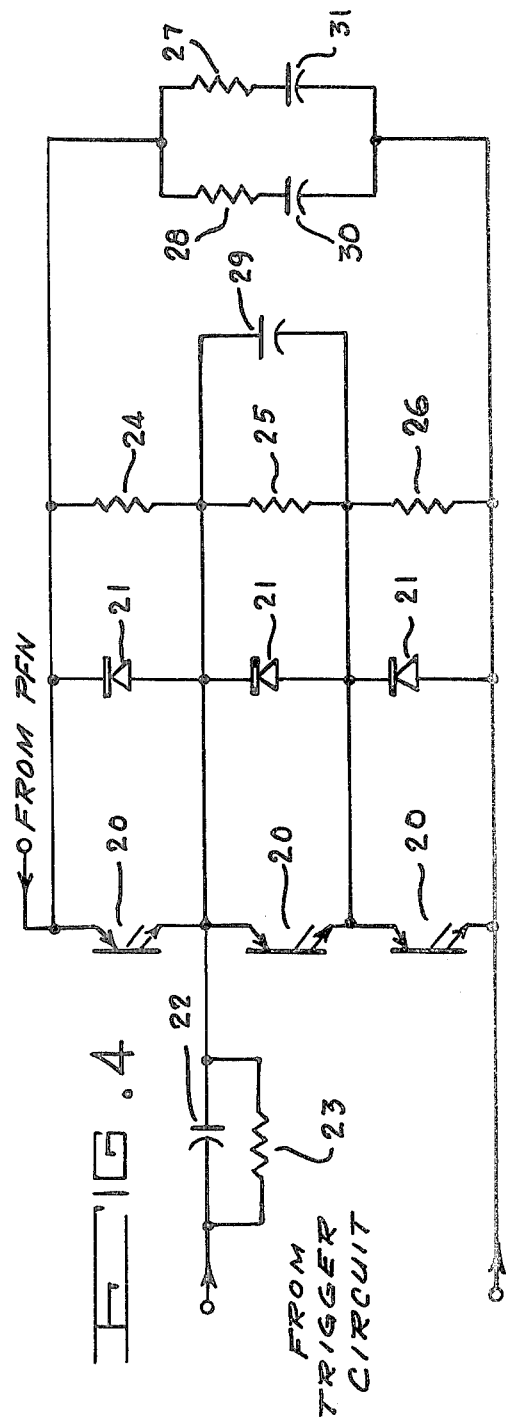

HIGH POWER PULSER

STATEMENT OF GOVERNMENT INTEREST

The invention described herein may be manufactured and used by or for the Government for governmental purposes without the payment of any royalty thereon.

BACKGROUND OF THE INVENTION

This invention relates to high power pulsers and in particular to a circuit arrangement that permits the charging of multiple parallel pulse forming networks (PFNs) directly from a polyphase A.C. source to achieve high peak power output pulses.

Conventional pulsers require a D.C. power supply, high voltage transformers, rectifiers, filters and energy storage capacitors and their operation entails energy conversion and storage between the primary power source and the pulser. Furthermore, in order to assure uniform loading on the generator or primary power source during the charging cycle, additional control means are necessary. The present invention comprehends a device that eliminates many of these elements, maintains a balanced A.C. load on the source, is well suited for modular construction techniques and utilizes design principles that are equally applicable to high voltage tube type pulsers as well as low voltage solid state type pulsers.

SUMMARY OF THE INVENTION

The invention is a sequentially charged, high power pulser that comprises a multiphase A.C. generator, each phase of which is fed to at least two parallel pulse forming networks. Controlled switches in each pulse forming network feed are actuated by a command charge switch circuit that effects sequential charging of the pulse forming networks as a function of A.C. generator output phase relationships. When all pulse forming networks are fully charged they are discharged simultaneously into an output transformer and load by means of a trigger and discharge circuit that operates periodically to provide an output pulse repetition rate that is a sub-multiple of the A.C. generator frequency.

It is a principle object of the invention to provide a new and improved high power pulser.

It is another object of the invention to provide a high power pulser that produces uniform loading on the generator or primary power source during the charging cycle.

It is another object of the invention to provide a high power pulser that eliminates unnecessary energy conversion and storage functions between the primary power source and the pulser.

It is another object of the invention to provide a high power pulser that eliminates the need for a D.C. power supply with its associated high voltages power transformer, rectifiers, filters, and energy storage capacitors.

It is another object of the invention to provide a high power pulser that maintains a balanced A.C. load on the source.

It is another object of the invention to provide a high power pulser that is readily adapted to modular construction techniques.

It is another object of the invention to provide high power pulser techniques that are equally applicable to high voltage tube type pulser as well as low voltage solid state type pulsers.

These together with other objects, features and advantages of the invention will become more readily apparent from the following detailed description when taken in conjunction with the accompanying drawings wherein like elements are given like reference numerals throughout.

DESCRIPTION OF THE DRAWINGS

FIG. 2 illustrates waveforms of the pulse forming network charging voltages and their phase relationships throughout one charging cycle;

FIG. 4 is a schematic diagram of a pulse-forming network discharge circuit; and, FIG. 5 is a schematic diagram of an alternative embodiment of the invention.

DESCRIPTION OF THE PREFERRED EMBODIMENTS

Figure 1:
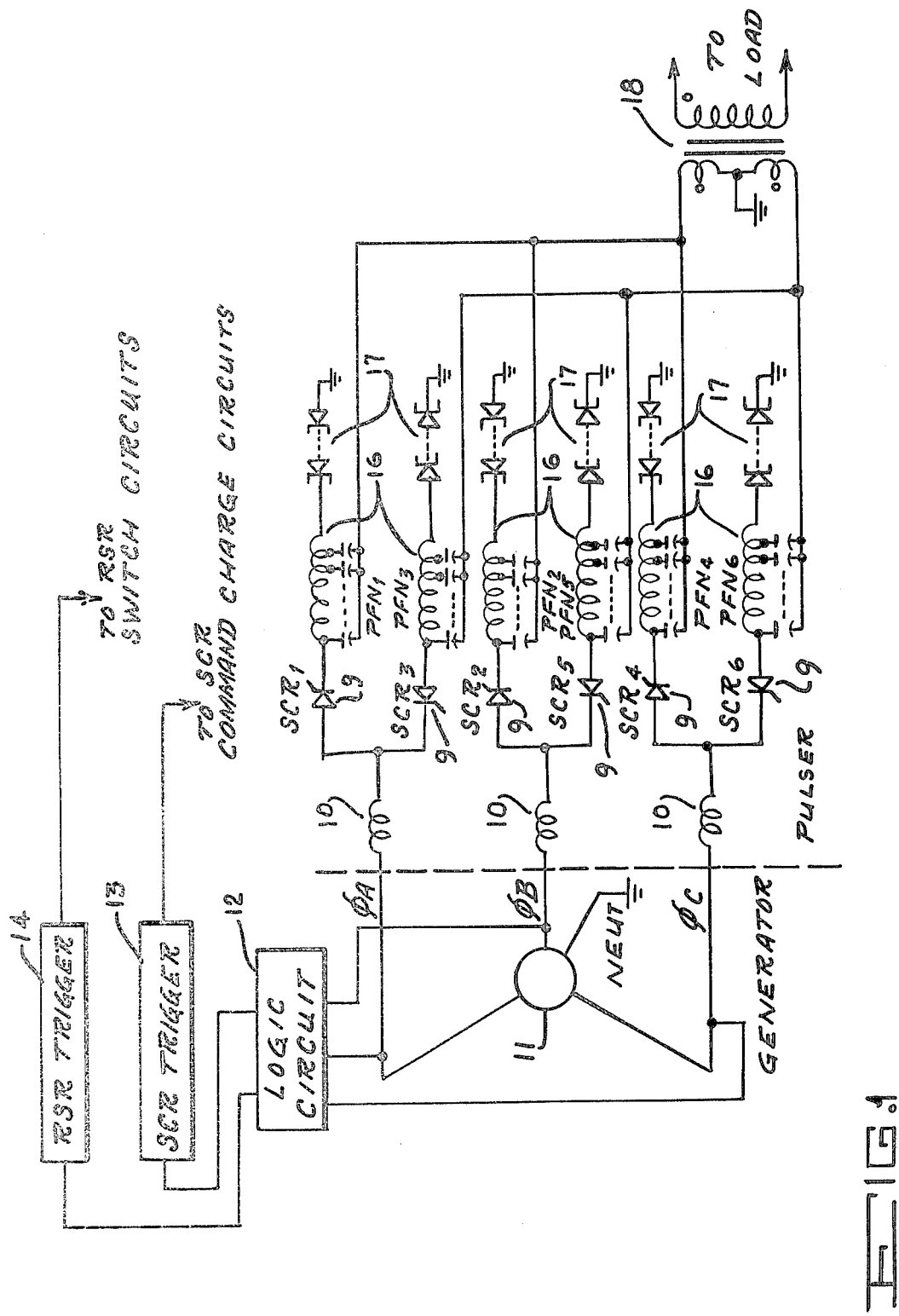
FIG. 1 is a schematic diagram of one presently preferred embodiment of the invention.

A high power pulser incorporating the principle of the invention as illustrated by the schematic diagram of FIG. 1. It comprises polyphase generator 11, logic circuit 12, SCR trigger circuit 13, RSR trigger circuit 14, resonant charging inductors 10, silicon controlled rectifier (SCR) switches 9, pulse formng networks (PFN) 16, reverse switching recitifiers (RSR) 17 and output transformers 18. FIGS. 1 and 2 illustrate the operation of the charging technique of the invention in a six RSR module system by way of example. It should be noted that "N" modules may be used per phase and "M" phases may be used. Also SCR's and RSR's are shown as the charging and discharging switches respectively; however, any suitable switch device may be used. In operation, PFN-1 is charged during the half cycle of phase-A voltage, beginning with the triggering of SCR1. The charging cycle ends when the PFN voltage reaches a peak and attempts to reverse current flow through the SCR. The SCR then recovers, blocks current flow, and maintains charge on the PFN until pulse discharge time. Continuing with the charging sequence, PFN-2 is charged next beginning with the gating of SCR-2 from the phase-B line. Then PFN-3 is charged to an opposing polarity to complete a full cycle of current on the phase-A line. The sequence continues as illustrated in FIG. 2 until all 6 PFN's are charged. The PFN's are then discharged simultaneously through a center tapped pulse transformer 18 to load. In this arrangement the SCR's are used as command charge devices to delay the charging of a specific network until a specific cycle.

This pulser concept optimizes the interface with generator by eliminating the DC power supply, and permits maximum utilization of the generator. Also, the AC charging concept minimizes the effect of generator internal reactances. Operation of the pulser in this mode requires that the modular pulser repetition rate must be a sub-muiltiple of the generator frequency.

The SCRs are controlled by conventional gate trigger type of circuitry.

Figure 3:
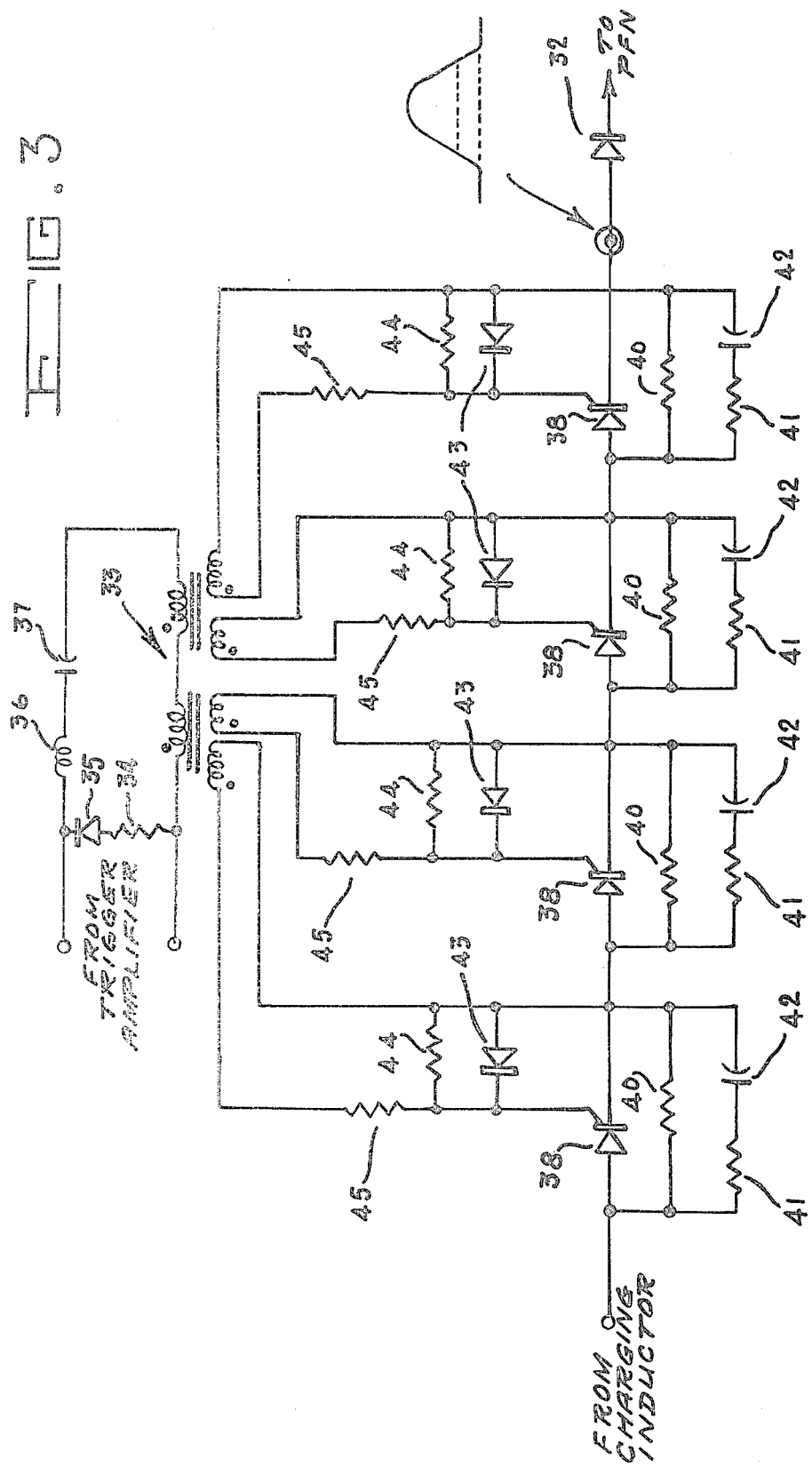
FIG. 3 is a schematic diagram of a command charge switching circuit.

FIG. 3 is a schematic diagram of the command charge switch circuit of the invention and is a specific example of the conventional gate to trigger type of circuitry. It is fed from the SCR trigger through the input network of diode 35, resistor 34, inductor 36, capacitor 37 and transformer 33. The switch circuit utilizes four SCRs 38 together with resistors 40, 41, 42, 44, 45 and diode 43 in the circuit arrangement shown.

Other types of controlled switches may be used instead of SCRs, i.e. tyratrons, ignitrons, transistors etc. depending upon the application, voltage and current levels involved. Resistors 40 across SCRs 38 provide low frequency voltage division. The RC circuits are transient suppression circuits which prevent dv/dt and noise triggering of the SCRs when the pulser discharge RSRs fires. Trigger pulse input to the four SCRs is accomplished by transformer coupling with transformer 33. The output diode 32 supports reverse voltages after the charging cycle and reduces the step displacement which occurs across the SCRs and the RSR switch fires.

FIG. 4 is a schematic diagram of the RSR switching circuit used for each of the six PFN modules of FIG. 1. By way of example, the three RSRs 20 can be 800 v hold off, 1,000 A pulse devices. RSR is an acronym for reverse switching rectifier. These devices are reverse blocking diode thyristers and are manufactured by the semiconductor division of Westinghouse Corporation. Other types of discharge devices may be used, however, such as thyratrons, ignitrons, triggered spark gaps, transistors, etc. The reverse diodes 21 across the RSRs prevent application of reverse voltage across the RSRs. Resistors 24, 25, 26 provide low frequency voltage division.

In operation, the stack of three RSRs is triggered using energy stored in the circuit. The trigger point is abruptly shorted to ground by an external trigger circuit. This causes voltage across the top RSR to leap upward with sufficient dV/dt that the top RSR turns on. This immediately causes voltage across the two lower RSRs to rise. The capacitor 29 across the middle RSR forces this change to appear entirely across the lower RSR causing it to fire. Then the middle RSR fires to complete the switch turn-on. Capacitors 30, 31 provide switching energy for the RSRs through current limiting resistors 27, 28.

Figure 5:
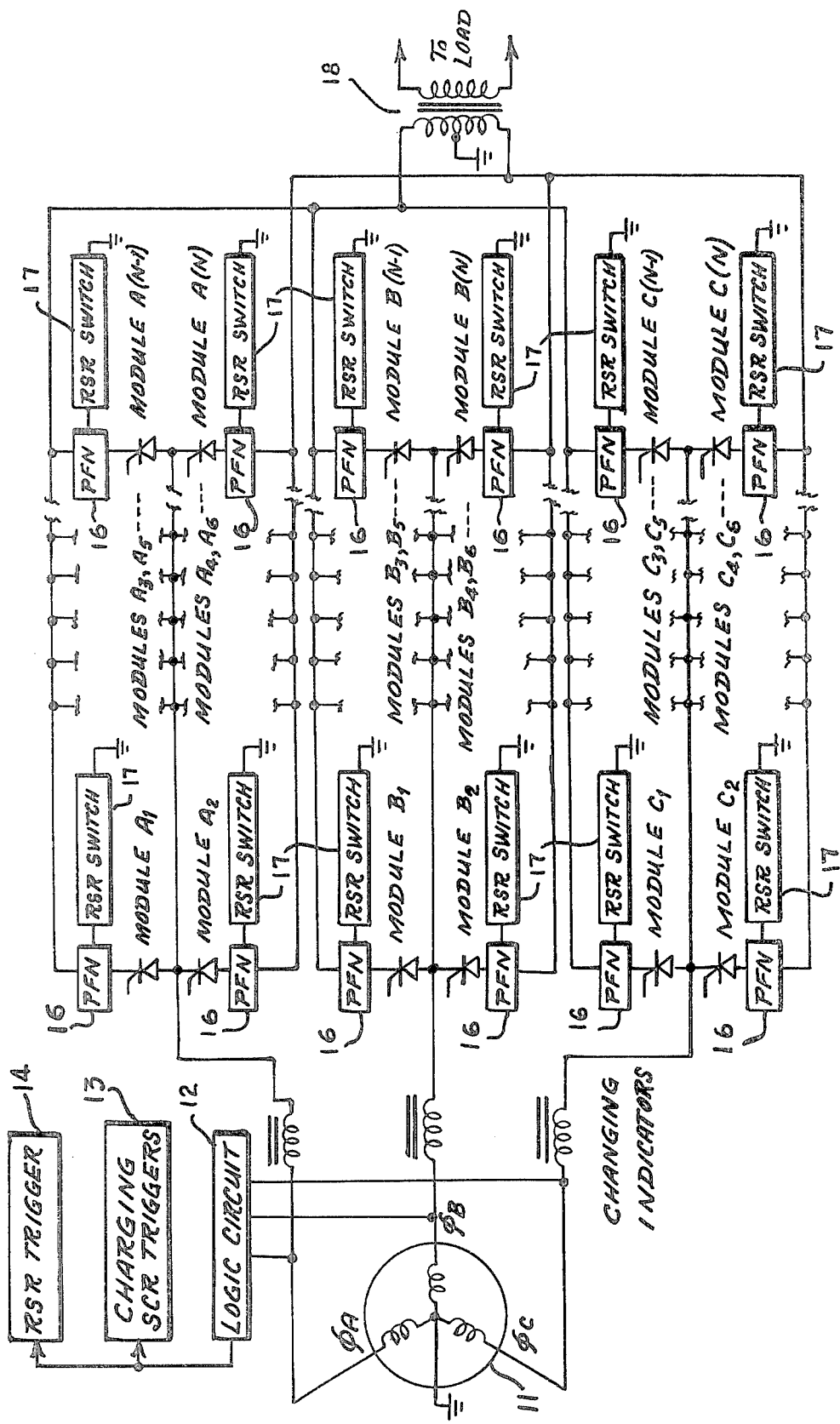

The expansion of the basic six module system of FIG. 1 into a 3N polyphase system is illustrated in FIG. 5 (N is the number of modules per phase). The charging sequence is adjusted so that one module at a time is charged from each line. The entire charging sequence requires a number of operating cycles of the generator. The total per pulse energy out of such a system is 3N times the stored energy per module. Storage voltage per module is 1.4 times the peak line-neutral voltage of the AC source.

A key consideration in this approach is the relationship between pulse repetition rate (PRF) and the generator frequency $f_g$. For the six module system, maximum PRF is $f_g/2$. For the multimodule system, with each module charged in sequence, the maximum PRF is $f_g$ divided by $(N/2)+1$ (N being number of sequentially charged modules per phase). This frequency can be increased by charging more than one module at a time in each sequence slot. This reduces the number of slots required. It is important to note that with this approach, the PRF of the pulser is related to the generator frequency.

While the invention has been described in its presently preferred embodiments, it is understood that the words which have been used are words of description rather than words of limitation, and that changes within the purview of the appended claims may be made without departing from the scope and spirit of the invention in its broader aspects.

What is claimed is:

1. A high power pulser comprising an m phase A.C. generator each phase feeding n parallel pulse forming networks, m and n being integers not less than 2, an output means, means comprising a controlled switch means controlling the input of each pulse forming network and a command charge switching circuit controlling said controlled switch means sequentially in response to A.C. generator output phase relationships for effecting sequential charging of said pulse forming networks by said A.C. generator, and means for simultaneously discharging said pulse forming neworks into said output means.

2. A high power pulser as defined in claim 1 wherein said means for simultaneously discharging said pulse forming networks comprises a pulse forming network discharge circuit, and trigger means, said trigger means activating said discharge circuit periodically to effect an output pulse repetition rate that is a sub-multiple of the A.C. generator frequency.

3. A high power pulser as defined in claim 2 wherein said pulse forming networks are line type A.C. resonant charging pulsers.

4. A high power pulser as defined in claim 3 including a resonant charging inductor in each A.C. generator phase feed line.

5. A high power pulser as defined in claim 4 wherein said controlled switch means are silicon controlled rectifiers.

6. A high power pulser as defined in claim 5 wherein said pulse forming network discharge circuit is a reverse switching rectifier switching circuit.

* * * * *